US009761605B1

United States Patent
Sekine

(10) Patent No.: US 9,761,605 B1
(45) Date of Patent: Sep. 12, 2017

(54) SEMICONDUCTOR MEMORY DEVICE

(71) Applicant: Kabushiki Kaisha Toshiba, Minato-ku (JP)

(72) Inventor: Katsuyuki Sekine, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/257,307

(22) Filed: Sep. 6, 2016

Related U.S. Application Data

(60) Provisional application No. 62/305,177, filed on Mar. 8, 2016.

(51) Int. Cl.
| | |
|---|---|
| *H01L 27/115* | (2017.01) |
| *H01L 27/11582* | (2017.01) |
| *H01L 23/528* | (2006.01) |
| *H01L 29/423* | (2006.01) |
| *H01L 29/51* | (2006.01) |
| *H01L 27/11565* | (2017.01) |
| *H01L 21/28* | (2006.01) |

(52) U.S. Cl.
CPC .. *H01L 27/11582* (2013.01); *H01L 21/28282* (2013.01); *H01L 23/528* (2013.01); *H01L 27/11565* (2013.01); *H01L 29/4234* (2013.01); *H01L 29/513* (2013.01); *H01L 29/518* (2013.01)

(58) Field of Classification Search
CPC ............. H01L 27/115; H01L 27/11568; H01L 29/792; H01L 29/6683
See application file for complete search history.

(56) References Cited

U.S. PATENT DOCUMENTS

| | | | |
|---|---|---|---|
| RE45,732 E | 10/2015 | Kiyotoshi | |
| 9,318,202 B2* | 4/2016 | Nam | .......... G11C 16/0483 |
| 2009/0294836 A1 | 12/2009 | Kiyotoshi | |
| 2011/0027981 A1 | 2/2011 | Kiyotoshi | |
| 2013/0221423 A1 | 8/2013 | Kawasaki et al. | |
| 2015/0060992 A1 | 3/2015 | Taekyung et al. | |

FOREIGN PATENT DOCUMENTS

| | | |
|---|---|---|
| JP | 2009-295694 | 12/2009 |
| JP | 2013-182949 | 9/2013 |
| JP | 2015-50466 | 3/2015 |

* cited by examiner

*Primary Examiner* — Quoc Hoang
(74) *Attorney, Agent, or Firm* — Oblon, McClelland, Maier & Neustadt, L.L.P.

(57) ABSTRACT

According to one embodiment, a semiconductor memory device includes a substrate; a stacked body; a first columnar portion; a second columnar portion; and a plurality of first interconnects. The stacked body is provided on the substrate and includes a plurality of electrode layers separately stacked each other. A distance between the first columnar portion and one end of the plurality of electrode layers in the first direction is smaller than a distance between the second columnar portion and the other end of the plurality of electrode layers in the first direction. In the same electrode layer, a first width of a first charge storage film of the first columnar portion is smaller than a second width of a second charge storage film of the second columnar portion.

20 Claims, 12 Drawing Sheets ved between the stacked body and the first charge storage film. The second columnar portion is provided in the stacked body and includes a second semiconductor film extending in the stacking direction, a second charge storage film provided between the stacked body and the second semiconductor film, and a second insulating film provided between the stacked body and the second charge storage film. The plurality of first interconnects is provided on the first columnar portion and the second columnar portion, and extends in a first direction crossing the stacking direction. A distance between the first columnar portion and one end of the plurality of electrode layers in the first direction is smaller than a distance between the second columnar portion and the other end of the plurality of electrode layers in the first direction. In the same electrode layer, a first width of the first charge storage film is smaller than a second width of the second charge storage film.

SEMICONDUCTOR MEMORY DEVICE

CROSS-REFERENCE TO RELATED APPLICATIONS

This application is based upon and claims the benefit of priority from U.S. Provisional Patent Application 62/305, 177 filed on Mar. 8, 2016; the entire contents of which are incorporated herein by reference.

FIELD

Embodiments described herein relate generally to a semiconductor memory device.

BACKGROUND

A semiconductor memory device having a three-dimensional structure is proposed, wherein memory holes are formed in a stacked body in which multiple electrode layers are stacked, and a charge storage film and a semiconductor film are provided in the memory hole to extend in a stacking direction of the stacked body. The semiconductor memory device includes multiple memory cells connected in series between a drain-side select transistor and a source-side select transistor. The electrode layers are gate electrodes of the drain-side select transistor, the source-side select transistor and the memory cells, and are formed by removing a portion of the stacked body via a slit of the stacked body and then filling a metal material in the removed portion. When removing the portion of the stacked body, there is a possibility that variation arises in the thickness of film formed in each memory hole depending on a distance between the memory hole and the slit. Thus, it is concerned that failure occurs in the operation of the memory cell.

Embodiments will now be described with reference to the drawings. In the respective drawings, same members are labeled with same reference numerals.

DETAILED DESCRIPTION

According to one embodiment, a semiconductor memory device includes a substrate; a stacked body; a first columnar portion; a second columnar portion; and a plurality of first interconnects. The stacked body is provided on the substrate and includes a plurality of electrode layers separately stacked each other. The first columnar portion is provided in the stacked body and includes a first semiconductor film extending in a stacking direction of the stacked body, a first charge storage film provided between the stacked body and the first semiconductor film, and a first insulating film pro-

First Embodiment

Figure 1:
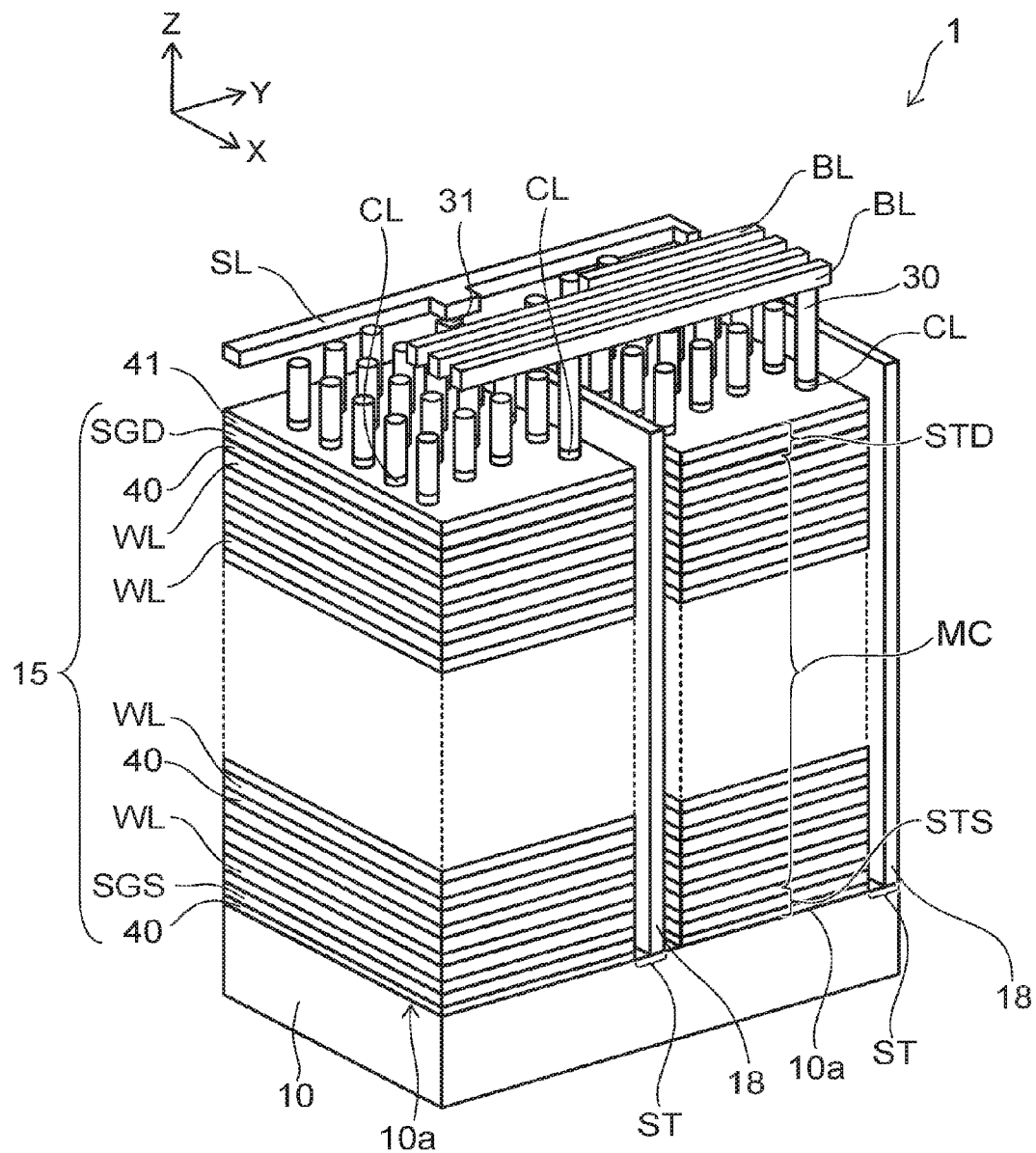
FIG. 1 is a perspective view of a semiconductor memory device of a first embodiment.
Figure 2:
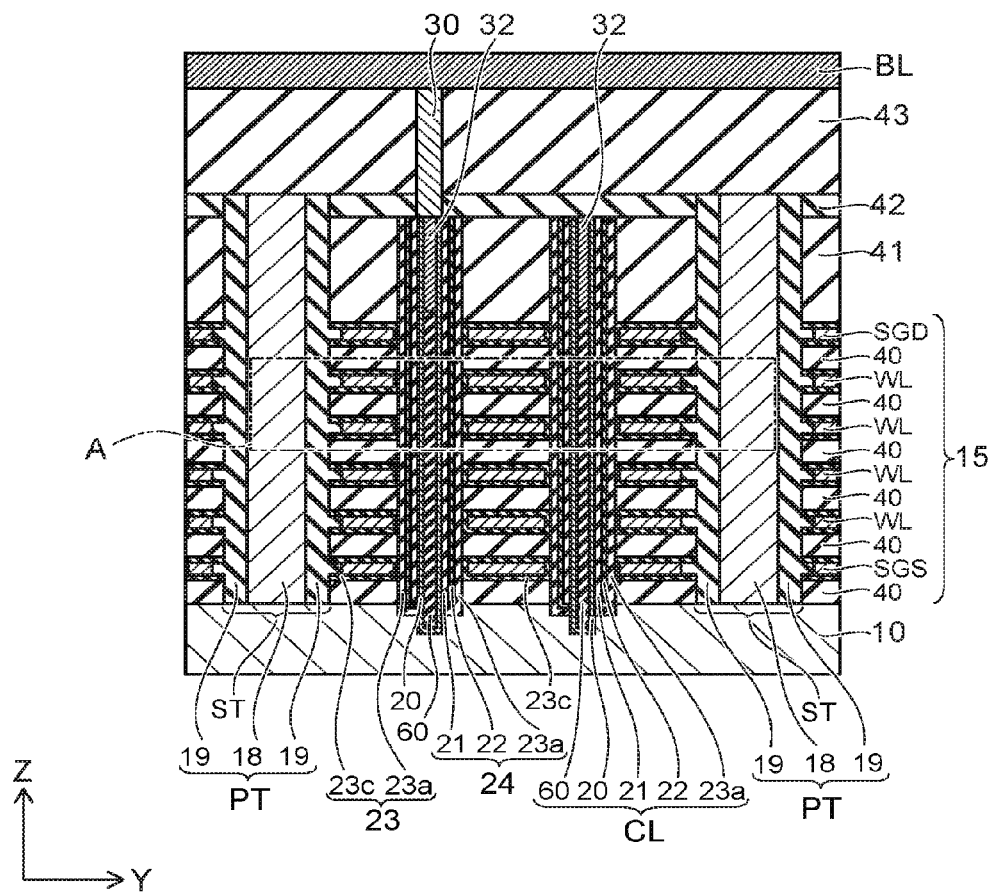
FIG. 2 is a cross-sectional view of the semiconductor memory device of the first embodiment.

FIG. 1 and FIG. 2 are a schematic perspective view and a cross-sectional view of a memory cell array of a semiconductor memory device 1 of a first embodiment. In the FIG. 1, illustrations of an insulating layer 42, an insulating layer 43, and an insulating film 19 are omitted.

In the specification, two mutually-orthogonal directions parallel to a major surface 10a of a substrate 10 are taken as an X-direction and a Y-direction. A direction orthogonal to both the X-direction and the Y-direction is taken as a Z-direction (the stacking direction of a stacked body 15).

As shown in FIG. 1, the semiconductor memory device 1 includes a stacked body 15 and a plurality of columnar portions CL. A plurality of slits ST is provided in the semiconductor memory device 1. The stacked body 15 includes a source-side select gate SGS, a drain-side select gate SGD, a plurality of word lines WL, and a plurality of insulating layers 40.

The source-side select gate SGS is provided on the substrate 10 via the insulating layer 40. The substrate 10 is, for example, a semiconductor substrate and includes silicon (Si) such as single-crystal silicon. The drain-side select gate SGD is provided at a top layer of the stacked body 15. The plurality of word lines WL is provided between the source-side select gate SGS and the drain-side select gate SGD. The source-side select gate SGS, the plurality of word lines WL, and the drain-side select gate SGD are electrode layers. The electrode layers contain, for example, metal such as tungsten (W). The number of stacked electrode layers is arbitrary.

The insulating layers 40 are provided between each of the electrode layers (SGS, WL, SGD), respectively. The insulating layers 40 contain, for example, silicon oxide ($SiO_2$).

An insulating layer 41 is provided on the stacked body 15. The insulating layer 41 contains, for example, silicon oxide.

The source-side select gate SGS and the drain-side select gate SGD are gate electrodes of a source-side select transistor STS and a drain-side select transistor SGD, respectively. A plurality of memory cells MC is connected in series between the source-side select transistor STS and the drain-side select transistor STD. One of the word lines is used as a gate electrode of the memory cell MC.

The plurality of columnar portions CL is provided in the stacked body 15. The columnar portion CL extends in the Z-direction in the stacked body 15. The columnar portion CL is formed in a cylindrical shape or an elliptic cylindrical shape. For example, the columnar portion CL is disposed in a staggered lattice configuration or a square lattice configuration in the X-Y plane.

A plurality of bit lines BL extending in the Y-direction is provided above the columnar portions CL. A top end of the columnar portion CL is connected to one of the bit lines BL via a contact portion 30. The contact portion 30 is a contact plug and made of conductor such as metal.

The slit ST is provided in the stacked body 15. The slit ST extends along the Z-direction and the X-direction in the stacked body 15. The slit ST divides the stacked body 15 into a plural in the Y-direction. The region that is divided by the slit ST is called a "block". One columnar portion CL which is selected from each block is electrically connected to one bit line BL.

The plurality of slits ST is provided in the stacked body 15, and an interconnect portion 18 is provided in the slit ST. The interconnect portion 18 extends in the Z-direction and the X-direction. A bottom end of the interconnect portion 18 is contact with the substrate 10. For example, the interconnect portion 18 contains metal such as tungsten (W).

A source line SL extending the Y-direction is provided above the interconnect portion 18. A top end of the interconnect portion 18 is connected to the source line SL via a contact portion 31. The contact portion 31 is a contact plug and made of conductor such as metal.

As shown in FIG. 2, the columnar portion CL includes a core portion 60, a semiconductor body 20, a tunneling insulating film 21, a charge storage film 22, and an oxide film 23a. For example, the core portion 60 contains silicon oxide ($SiO_2$). A shape of the core portion 60 is, for example, a columnar shape.

The semiconductor body 20 is provided around the core portion 60. The semiconductor body 20 contains silicon, for example, polysilicon made of crystallized amorphous silicon. A shape of the semiconductor body 20 is, for example, a cylinder shape with a bottom. A bottom end of the semiconductor body 20 is contact with the substrate 10.

A plug portion 32 is provided on a top end of the core portion 60. The plug portion 32 is located in the insulating layer 41, and the semiconductor body 20 surrounds the plug portion 32. For example, the plug portion 32 is formed by the same material as the semiconductor body 20.

The tunneling insulating film 21 is provided around the semiconductor body 20. The tunneling insulating film 21 contains, for example, silicon oxide. For example, a shape of the tunneling insulating film 21 is a cylinder shape.

The charge storage film 22 is provided around the tunneling insulating film 21. For example, the charge storage film 22 contains silicon nitride ($Si_3N_4$). For example, a shape of the charge storage film 22 is a cylinder shape. The memory cell MC including the charge storage film 22 is provided at an intersection between the semiconductor body 20 and the word line WL.

The tunneling insulating film 21 is a potential barrier between the charge storage film 22 and the semiconductor body 20. Tunneling of the charge occurs in the tunneling insulating film 21 when the charge is moved from the semiconductor body 20 to the charge storage film 22 (a programming operation) and when the charge is moved from the charge storage film 22 to the semiconductor body 20 (an erasing operation).

The charge storage film 22 has a trap site trapping the charge in the film. The threshold of the memory cell MC changes due to the presence/absence and amount of the charge trapped in the trap site. Thereby, the memory cell MC retains information.

The oxide film 23a is provided around the charge storage film 22. For example, the oxide film 23a contains silicon oxide ($SiO_2$). When forming the electrode layers (SGS, WL, SGD), the oxide film 23a protects, for example, the charge storage film 22 from etching. The memory film 24 is composed of the tunneling insulating film 21, the charge storage film 22, and the oxide film 23a.

An oxide film 23c is provided around the oxide film 23a. Also, the oxide film 23c is provided between each of the electrode layers (SGS, WL, SGD) and the insulating layer 40. For example, the oxide film 23c contains aluminum oxide ($Al_2O_3$). A blocking insulating film 23 is composed of the oxide film 23a and the oxide film 23c.

The insulating layer 42 is provided on the columnar portion CL and the insulating layer 41. The insulating layer 43 is provided on the insulating layer 42. The insulating layer 42 and the insulating layer 43 contain, for example, silicon oxide. The contact portion 30 is located in the insulating layer 42 and the insulating layer 43. A top end of the contact portion 30 is connected to the bit line BL, and a bottom end of the contact portion 30 is connected to the plug portion 32.

The insulating film 19 is provided in the slit ST. The insulating film 19 is provided at the sidewall of the interconnect portion 18 and extends in the Z-direction and the X-direction. The insulating film 19 contains, for example, silicon oxide. The insulating film 19 electrically insulates the interconnect portion 18 and each of the electrode layers (SGS, WL, SGD) of the stacked body 15.

A plate portion PT is composed of the interconnect portion 18 and the insulating film 19. The plate portion PT penetrates the insulating layer 42, the insulating layer 41, and the stacked body 15, and a bottom end of the plate portion PT is contact with the substrate 10.

Figure 3:
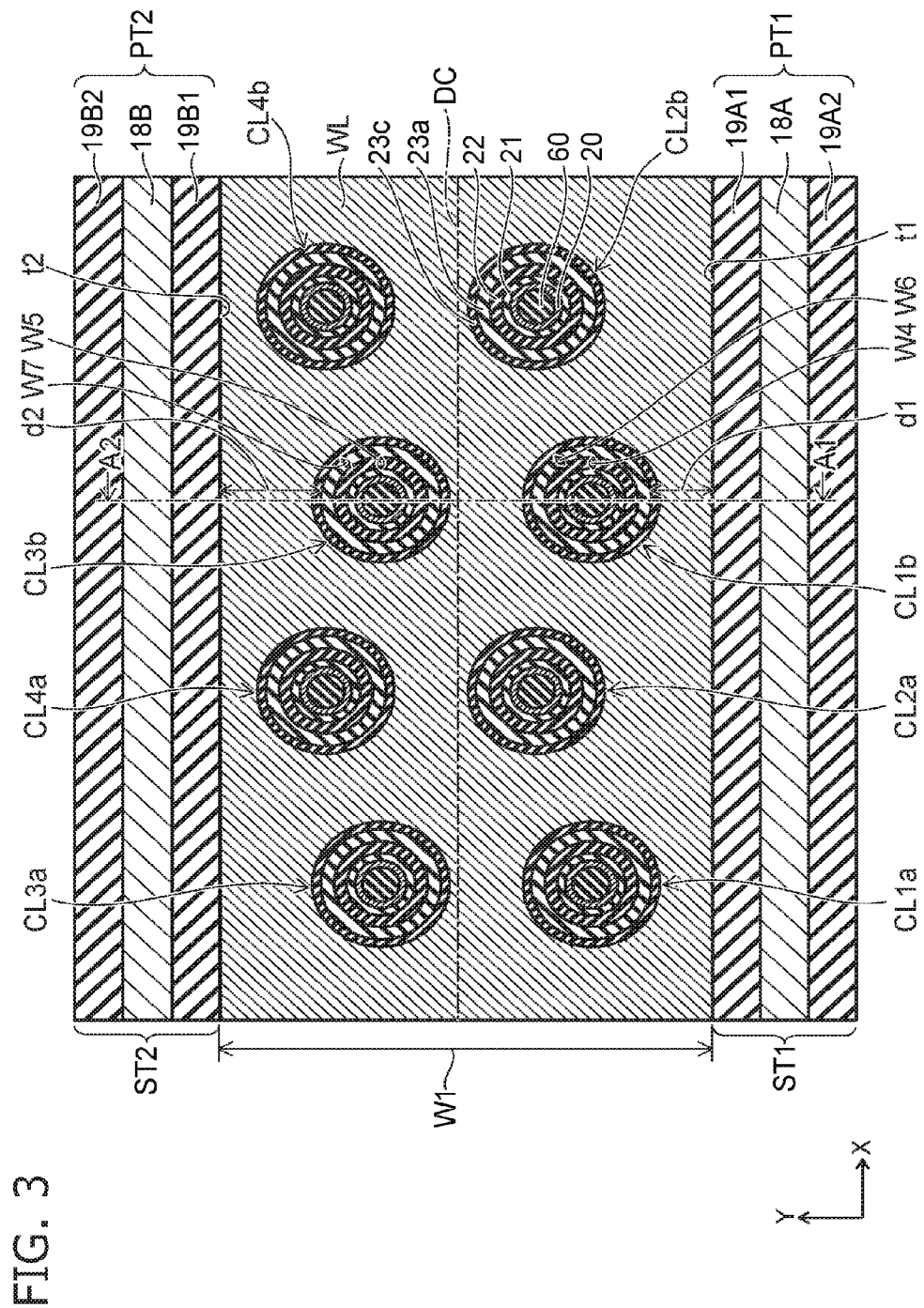
FIG. 3 is a plan view of a part of the semiconductor memory device of the first embodiment.
Figure 4:
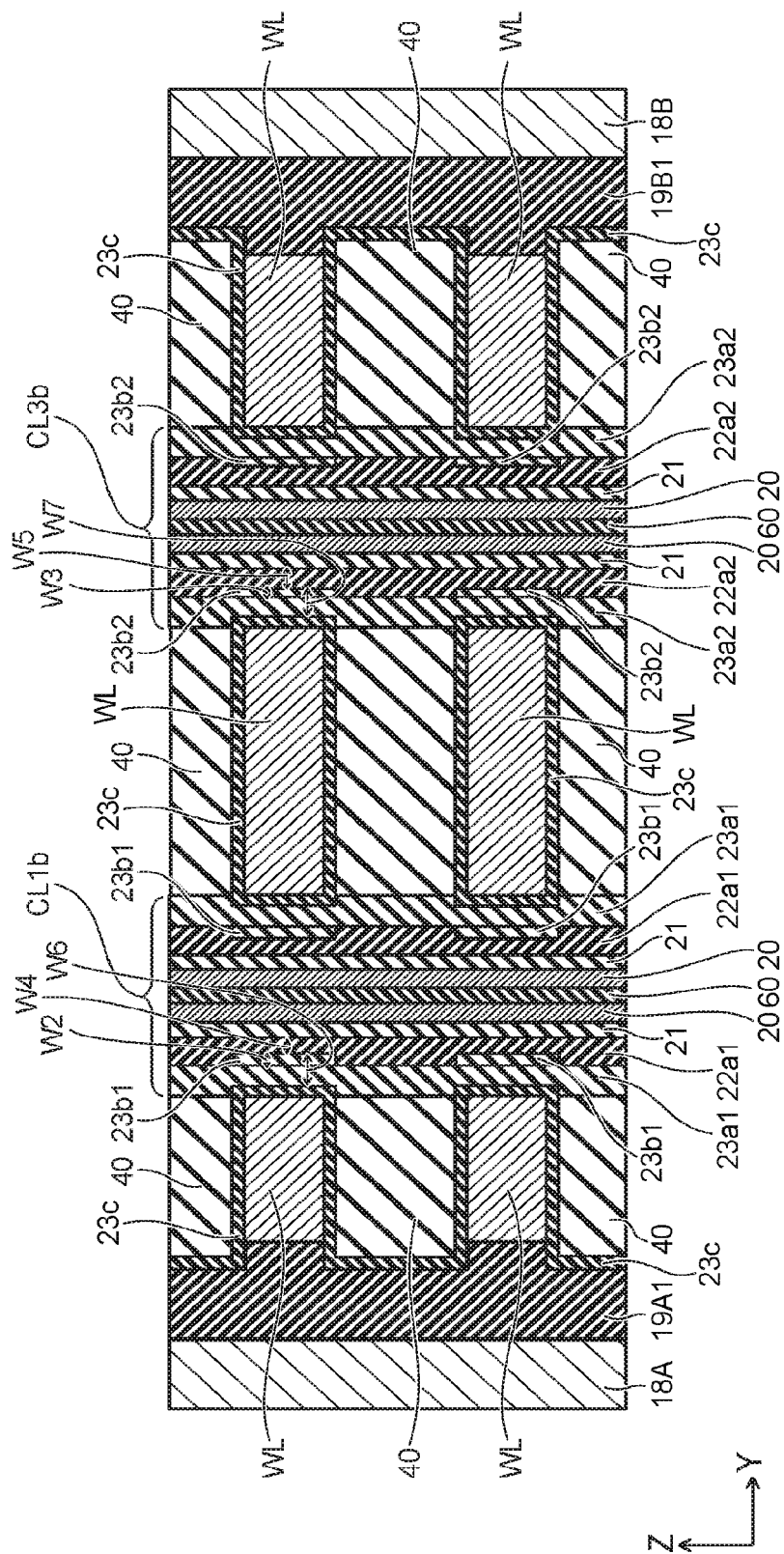
FIG. 4 is a cross-sectional view of a part of the semiconductor memory device of the first embodiment.

FIG. 3 is an enlarged plan view extracting one portion of the word line WL between the slits ST. FIG. 4 is an enlarged view of an area A of FIG. 2, and is a view including an area corresponding to the Y-Z cross-section by the A1-A2 line of FIG. 3.

As shown in FIG. 3, the interconnect portion 18A, the insulating film 19A1, and the insulating film 19A2 extending in X-direction are provided in the slit ST1. The plate portion PT1 is composed of the interconnect portion 18A, the insulating film 19A1, and the insulating film 19A2. The interconnect portion 18B, the insulating film 19B1, and the insulating film 19B2 extending in the X-direction are provided in the slit ST2. The plate portion PT2 is composed of the interconnect portion 18B, the insulating film 19B1, and the insulating film 19B2.

As viewed in the Z-direction, the plurality of columnar portions CL is disposed in a staggered lattice configuration between the slit ST1 and the slit ST2. The columnar portions CL1a, CL1b, CL2a, CL2b, CL3a, CL3b, CL4a, CL4b are disposed in the word line WL.

If a virtual straight line along the X-direction has been set on the word line WL, the columnar portion CL1a and the columnar portion CL1b are located on the same straight line. Further, if a virtual straight line along the X-direction has been set on the word line WL, the columnar portion CL2a and the columnar portion CL2b, the columnar portion CL3a and the columnar portion CL3b, and the columnar portion CL4a and the columnar portion CL4b are located on the same straight line, respectively. Here, the number of the columnar portions CL is arbitrary.

If a straight line DC is the reference, the columnar portions CL1a, CL1b, CL2a, CL2b are disposed at the slit ST1 side of the word line WL, and the columnar portions CL3a, CL3b, CL4a, CL4b are disposed at the slit ST2 side of the word line WL. The straight line DC is a virtual straight line which is set along the X-direction on the word line WL; and when the width of the word line WL in the Y-direction is represented by W1, the straight line DC is the straight line located at a distance of W1/2 in Y-direction from the slit ST1 and the slit ST2.

Among the columnar portions CL1a, CL1b, CL2a, CL2b disposed at the slit ST1 side, distances in the Y-direction between the columnar portion CL1a and the slit ST1 and between the columnar portion CL1b and the slit ST1 are short as compared with distances in the Y-direction between the columnar portion CL2a and the slit ST1 and between the columnar portion CL2b and the slit ST1. In other words, the columnar portions CL1a, CL1b are disposed so that the distances in the Y-direction between the columnar portion CL1a and the slit ST1 and between the columnar portion CL1b and the slit ST1 are the shortest distance among all the columnar portions CL.

Among the columnar portions CL3a, CL3b, CL4a, CL4b disposed at the slit ST2 side, distances in the Y-direction between the columnar portion CL4a and the slit ST2 and between the columnar portion CL4b and the slit ST2 are short as compared with distances in the Y-direction between the columnar portion CL3a and the slit ST2 and between the columnar portion CL3b and the slit ST2. In other words, the columnar portions CL4a, CL4b are disposed so that the distances in the Y-direction between the columnar portion CL4a and the slit ST2 and between the columnar portion CL4b and the slit ST2 are the shortest distance among all the columnar portions CL.

The columnar portions CL1a, CL1b, CL4a, CL4b are disposed so that the distance is shortest between any of the slit ST1 and the slit ST2. On the other hand, the columnar portions CL2a, CL2b, CL3a, CL3b are disposed in a central portion of the word line WL that the straight line DC is formed.

That is, the columnar portions CL1a, CL1b, CL4a, CL4b are disposed at the outside of the word line WL, and the columnar portions CL2a, CL2b, CL3a, CL3b are disposed at the inside of the word line WL. In this case, the columnar portions CL1a, CL1b, CL4a, CL4b are disposed at the outside of the insulating layer 40, and the columnar portions CL2a, CL2b, CL3a, CL3b are disposed at the inside of the insulating layer 40.

The distance between the slit ST and the columnar portion CL disposed at the outside of the word line WL is shorter as compared with the distance between the slit ST and the columnar portion CL disposed at the inside of the word line WL. For example, a distance d1 in the Y-direction between the slit ST1 and the columnar portion CL1b disposed at the outside of the word line WL is smaller than a distance d2 in the Y-direction between the slit ST2 and the columnar portion CL3b disposed at the inside of the word line WL. The distance d1 is a distance between the columnar portion CL1b and an end portion t1 of the word line WL, and the distance d2 is a distance between the columnar portion CL3b and an end portion t2 of the word line WL.

Hereinafter, the columnar portions CL which are disposed at the outside and the inside of the word line WL, respectively will now be described.

As shown in FIG. 4, the columnar portions CL1b, CL3b are located in the word line WL.

In the columnar portion CL1b which is located in the word line WL, the oxide film 23a1 has an oxide portion 23b1 provided around the charge storage film 22a1. The oxide portion 23b1 overlaps with a part of the charge storage film 22a1 of the columnar portion CL1b which is located in the insulating layer 40, as viewed in the Z-direction.

In the columnar portion CL3b which is located in the word line WL, the oxide film 23a2 has an oxide portion 23b2 provided around the charge storage film 22a2. The oxide portion 23b2 overlaps with a part of the charge storage film 22a2 of the columnar portion CL3b which is located in the insulating layer 40, as viewed in the Z-direction.

The oxide portion 23b1 is a portion which is formed by oxidizing a part of the charge storage film 22a1 of the columnar portion CL1b located in the word line WL. The oxide portion 23b2 is a portion which is formed by oxidizing a part of the charge storage film 22a2 of the columnar portion CL3b located in the word line WL. If the charge storage films 22a1, 22a2 are formed by silicon nitride, the oxide portions 23b1, 23b2 are, for example, formed by radical oxidizing of the silicon nitride.

In the columnar portions CL1b, CL3b located in the same word line WL, a width W2 of the oxide portion 23b1 of the columnar portion CL1b is greater than a width W3 of the oxide portion 23b2 of the columnar portion CL3b. Further, a width W4 of the charge storage film 22a1 of the columnar portion CL1b is smaller than a width W5 of the charge storage film 22a2 of the columnar portion CL3b. The width W4 and the width W5 may be thicknesses capable of storing charges in the charge storage films 22a1, 22a2, and the thicknesses are, for example, 5 nanometers or more. Further, a width W6 of the oxide film 23a1 of the columnar portion CL1b is a width W7 of the oxide film 23a2 of the columnar portion CL3b or less. For example, the width W6 and the width W7 will be approximately the same.

Here, in the specification, "the columnar portions CL are located in the same word line WL" refers to the columnar portions CL are located in one of the same word line WL which extends in the X-direction in the stacked body 15.

For example, in the columnar portion CL1b located in the different word lines WL, widths of the charge storage film 22a1 of the columnar portion CL1b will be approximately the same. Further, widths of the oxide film 23a1 of the columnar portion CL1b will be approximately the same.

For example, in the columnar portion CL3b located in the different word lines WL, widths of the charge storage film 22a2 of the columnar portion CL3b will be approximately the same. Further, widths of the oxide film 23a2 of the columnar portion CL3b will be approximately the same.

Hereinafter, a method for manufacturing the semiconductor memory device according to the first embodiment will now be described.

FIG. 5 to FIG. 12 are cross-sectional views showing a manufacturing method of the semiconductor memory device of the first embodiment.

First, a flow of the manufacturing method of the semiconductor memory device 1 will be briefly described with reference to FIG. 5 to FIG. 9. FIG. 5 to FIG. 8 are cross-sectional views showing a manufacturing process of a region shown in FIG. 2, and show a portion lower than the insulating layer 43. FIG. 9 is an enlarged view of a region "B" shown in FIG. 8.

Figure 5:
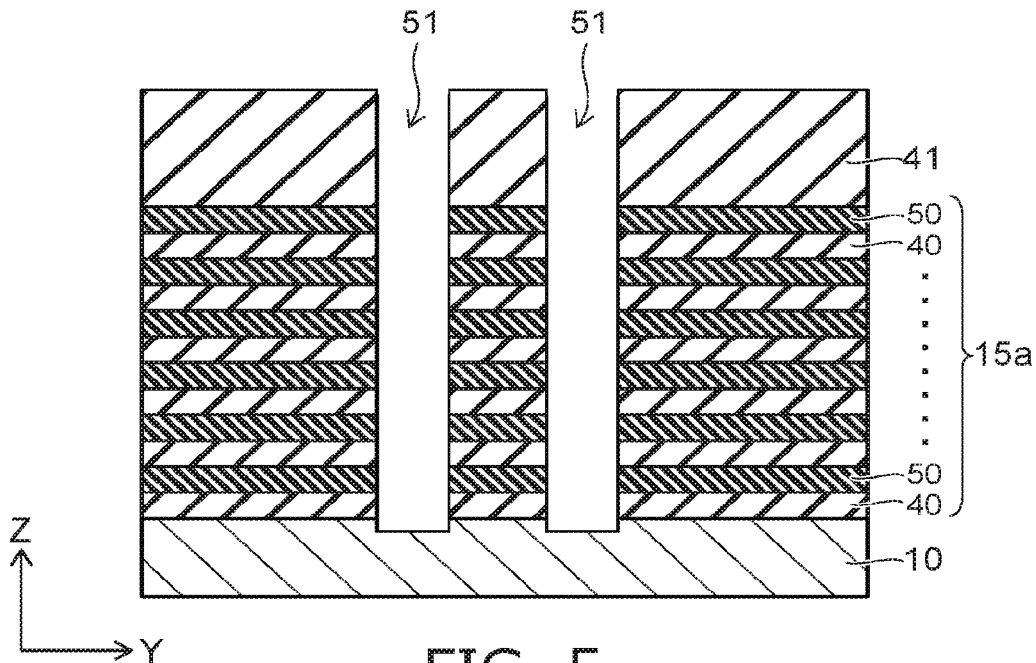
FIG. 5 to FIG. 12 are cross-sectional views showing a manufacturing method of the semiconductor memory device of the first embodiment.

First, as shown FIG. 5, the insulating layer 40 and the sacrificial layer 50 are alternately stacked on the substrate 10 along the Z-direction by, for example, CVD (Chemical Vapor Deposition) method to form a stacked body 15a. For example, the insulating layer 40 is formed using silicon oxide. The sacrificial layer 50 is formed using a material, which may be takes an etching selectivity ratio with respect to the insulating layer 40, and is formed using silicon nitride, for example. After that, the insulating layer 41 is formed on the stacked body 15a.

Continuously, a plurality of memory holes 51 (through holes) is formed in the insulating layer 41 and the stacked body 15a by, for example, RIE (Reactive Ion Etching). The memory holes 51 extend in the Z-direction, pierce the insulating layer 41 and the stacked body 15a, and reach the substrate 10. For example, as viewed in the Z-direction, the memory holes 51 having a circular shape are disposed in a staggered configuration.

Figure 6:
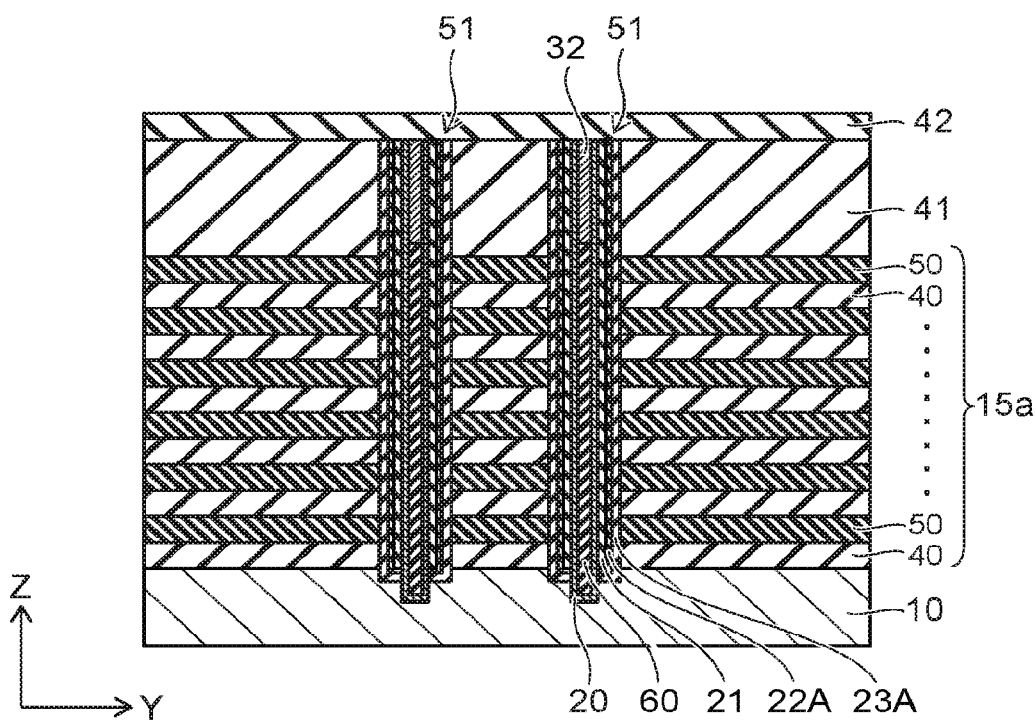

Then, as shown FIG. 6, by, for example, CVD method, silicon oxide is deposited on an inner surface of the memory hole 51 to form an oxide film 23A, silicon nitride is deposited to form a nitride film 22A, and silicon oxide is deposited to form the tunneling insulating film 21. After that, the tunneling insulating film 21, the nitride film 22A, and the oxide film 23A are removed from a bottom surface of the memory hole 51 by performing RIE to expose the substrate 10. After that, the semiconductor body 20 is formed by depositing silicon, and the core portion 60 is formed by depositing silicon oxide. The semiconductor body 20 is contact with the substrate 10. After that, the plug portion 32 is formed by removing an upper portion of the core portion 60 using etch back, and embedding silicon that impurities are doped. After that, the insulating layer 42 is formed on the insulating layer 41.

Figure 7:
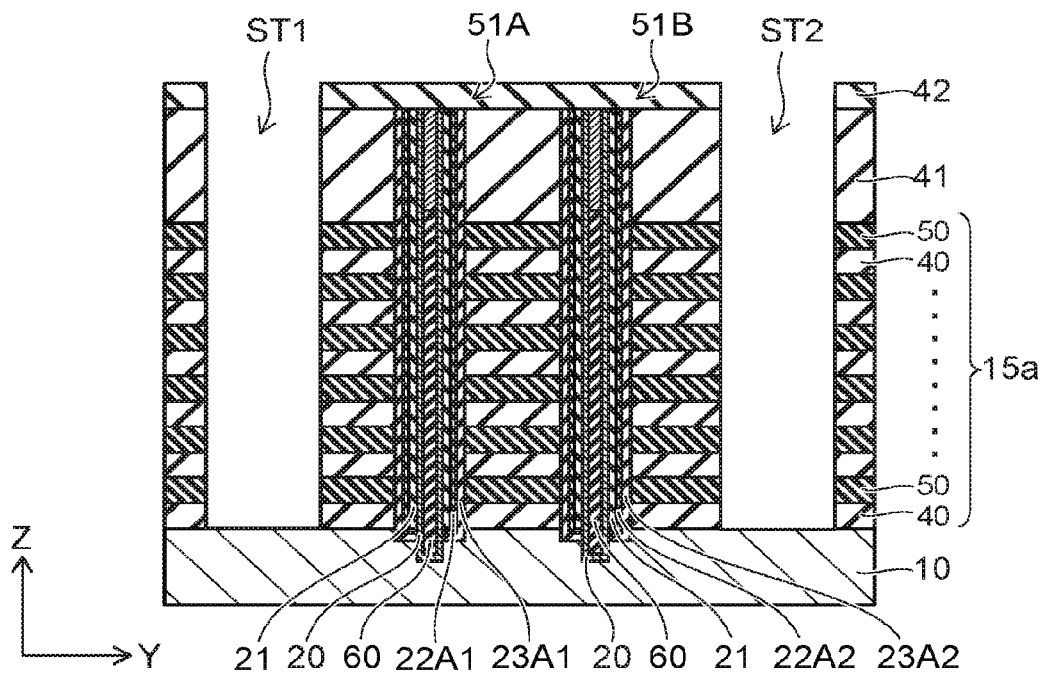

Then, as shown FIG. 7, a plurality of slits ST1, ST2 extending in the X-direction are formed in the stacked body 15a by, for example, anisotropic etching such as RIE. The slits ST1, ST2 are caused to pierce the insulating layer 42, the insulating layer 41, and the stacked body 15a. Thereby, the stacked body 15a is divided into a plurality of stacked bodies extending in the X-direction by the slits ST1, ST2.

Further, by forming the slits ST1, ST2, one of the memory holes 51 (the memory hole 51A) shown in FIG. 7 is disposed at outsides of the insulating layer 40 and the sacrificial layer 50, and the other of the memory holes 51 (the memory hole 51B) shown in FIG. 7 is disposed at insides of the insulating layer 40 and the sacrificial layer 50. The nitride film 22A1 and the oxide film 23A1 are formed in the memory hole 51A, and the nitride film 22A2 and the oxide film 23A2 are formed in the memory hole 51B.

Figure 8:
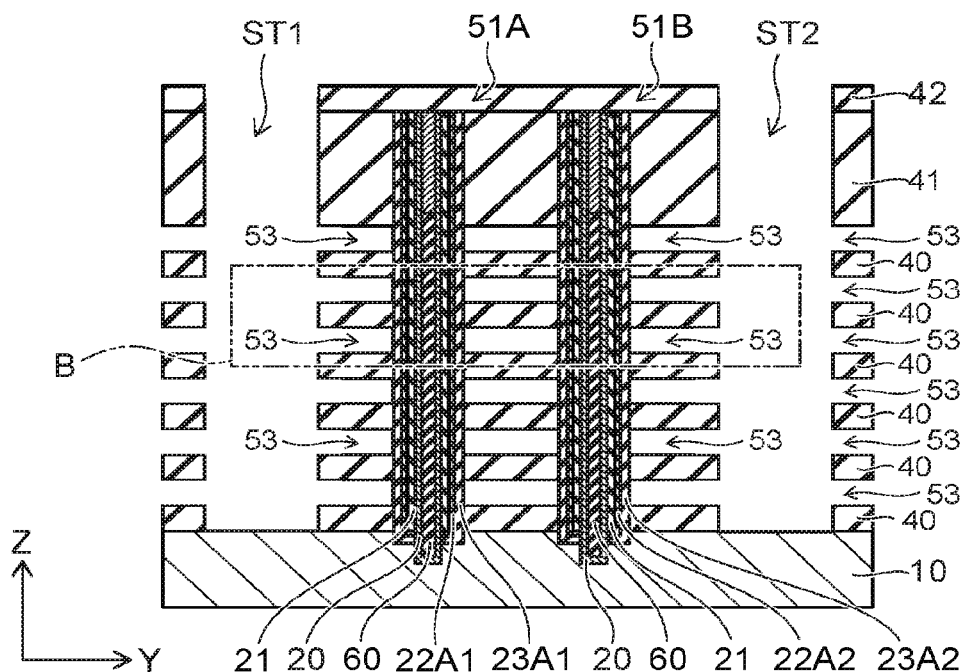
Figure 9:
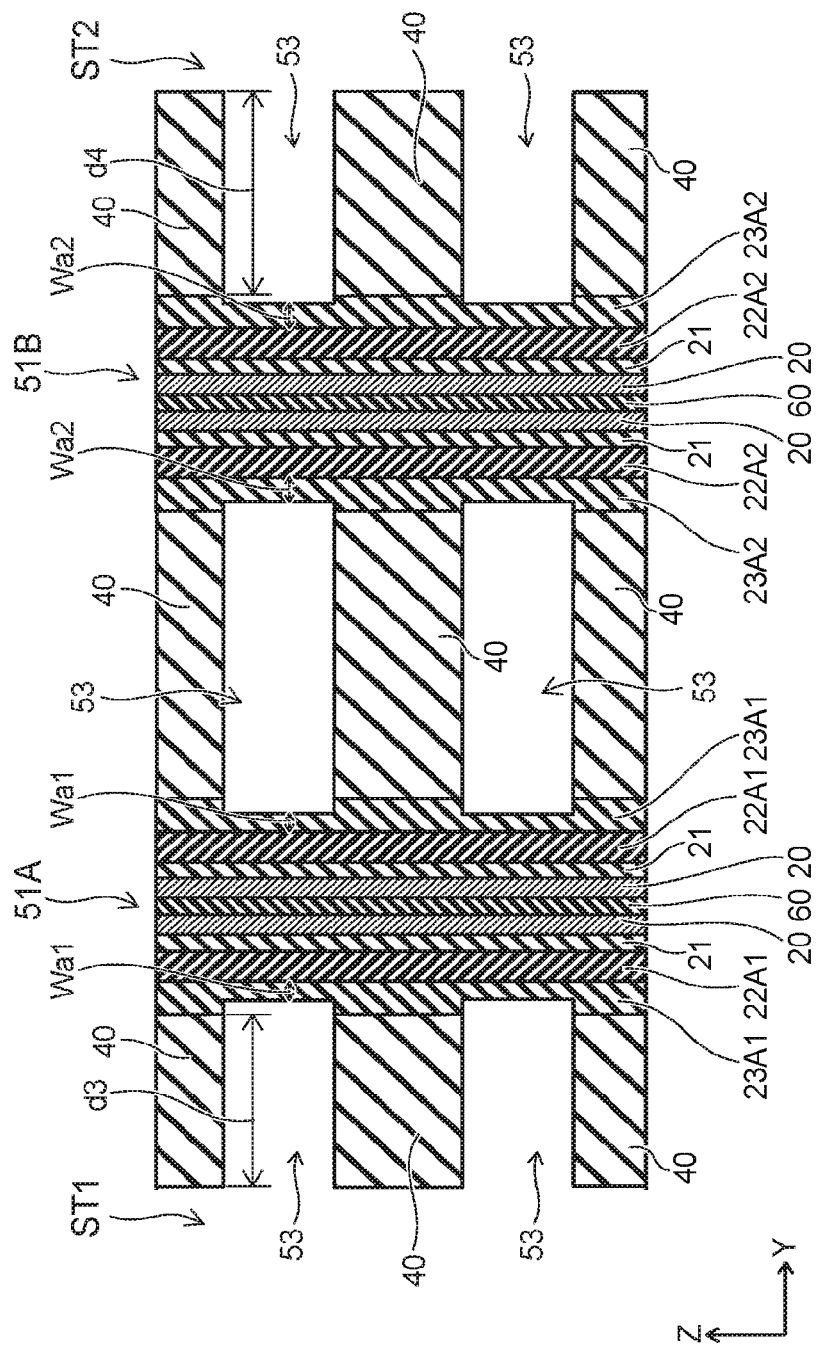

Then, as shown FIG. 8, the sacrificial layers 50 are removed by performing wet etching via the slits ST1, ST2. If the sacrificial layers 50 are formed by silicon nitride, phosphoric acid is used as an etchant of the wet etching, and the processing is performed using hot phosphoric acid. By removing the sacrificial layers 50 via the slits ST1, ST2, spaces 53 are formed.

Further, as shown FIG. 9, in the spaces 53 that positions in the Z-direction are same, a width Wa1 of the oxide film 23A1 of the memory hole 51A is smaller than a width Wa2 of the oxide film 23A2 of the memory hole 51B. A distance d3 between the slit ST1 and the memory hole 51A is smaller than a distance d4 between the slit ST2 and the memory hole 51B. Therefore, when removing the sacrificial layers 50, the oxide film 23A1 is in contact with hot phosphoric acid long time as compared with the oxide film 23A2. If a time of the oxide film 23A1 exposed to hot phosphoric acid is longer than a time of the oxide film 23A2 exposed to hot phosphoric acid, the oxide film 23A1 is further etched by hot phosphoric acid, and the film thickness of the oxide film 23A1 is smaller than the film thickness of the oxide film 23A2.

The above is a simplified flow of a manufacturing method of the semiconductor memory device 1, but in the embodiment, the formation of the oxide film 23a, the oxide film 23c, and the electrode layers (SGS, WL, SGD) are performed as follows. About this process will be described with reference to FIG. 10 to FIG. 12. Here, cross-sections shown in FIG. 10 to FIG. 12 correspond to the cross-section shown in FIG. 9.

Figure 10:
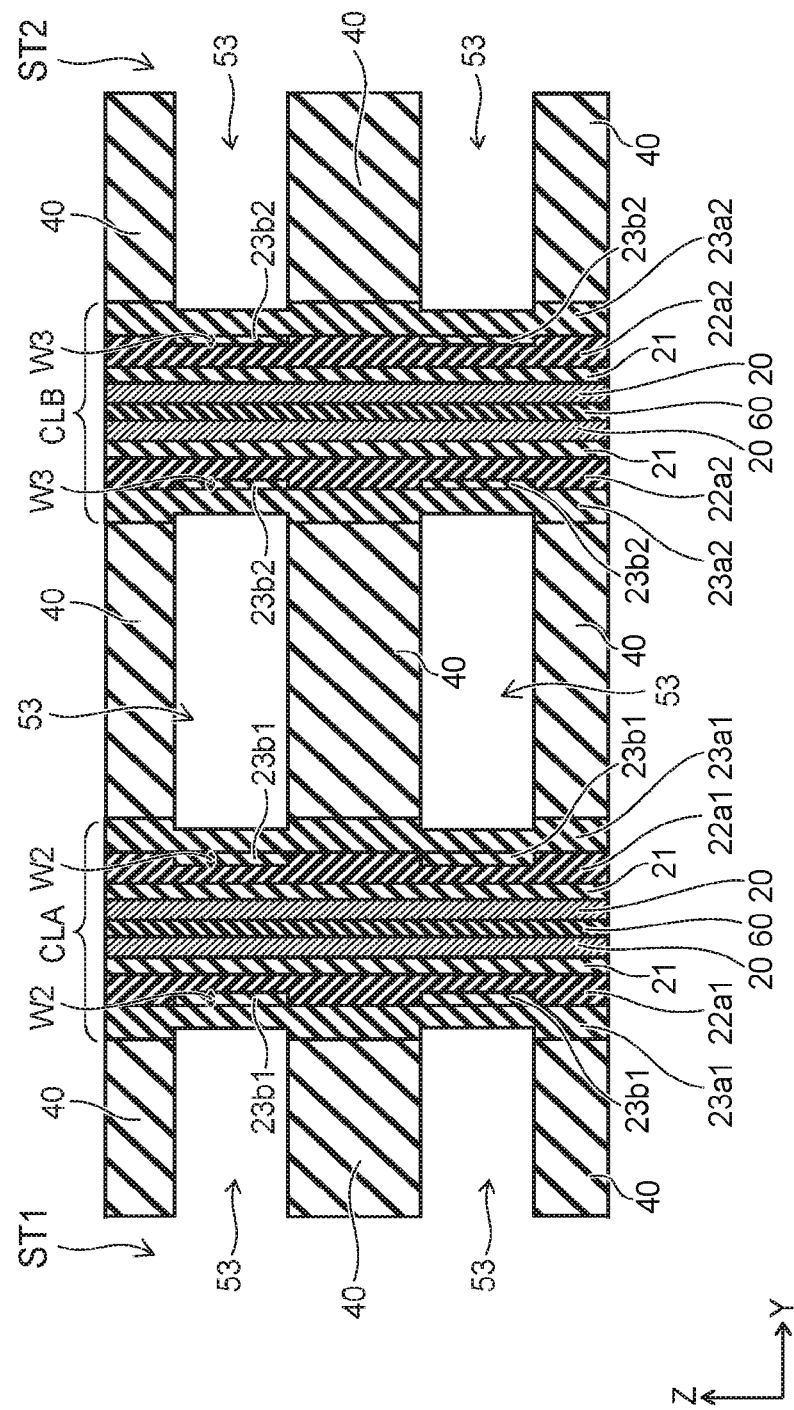

After the steps shown in FIG. 8 and FIG. 9, as shown in FIG. 10, radical oxidation process is performed to the nitride films 22A1, 22A2 via the slits ST1, ST2, and the spaces 53. A part of the nitride film 22A1 is oxidized via the oxide film 23A1 in the memory hole 51A, and a part of the nitride film 22A2 is oxidized via the oxide film 23A2 in the memory hole 51B. Further, by the radical oxidation process, side surfaces of the oxide films 23A1, 23A2 are expanded to both side of the Y-direction.

Thereby, the charge storage film 22a1 and the oxide film 23a1 are formed in the memory hole 51A, and the charge storage film 22a2 and the oxide film 23a2 are formed in the memory hole 51B. The oxide films 23a1, 23a2 have the oxide portions 23b1, 23b2, respectively. Since the width of the oxide film 23A1 is smaller than the width of the oxide film 23A2, the nitride film 22A1 is easily oxidized than the nitride film 22A2. Therefore, the width W2 of the oxide portion 23b1 is greater than the width W3 of the oxide portion 23b2.

Further, the columnar portion CLA is formed in the memory hole 51A, and includes the core portion 60, the semiconductor body 20, the tunneling insulating film 21, the charge storage film 22a1, and the oxide film 23a1. The columnar portion CLB is formed in the memory hole 51B, and includes the core portion 60, the semiconductor body 20, the tunneling insulating film 21, the charge storage film 22a2, and the oxide film 23a2. The columnar portion CLA is disposed at the outside of the insulating layer 40, and the columnar portion CLB is disposed at the inside of the insulating layer 40. For example, the columnar portion CLA corresponds to any of the columnar portions CL1a, CL1b, CL4a, CL4b as shown in FIG. 3. The columnar portion CLB corresponds to any of the columnar portions CL2a, CL2b, CL3a, CL3b as shown in FIG. 3.

Figure 11:
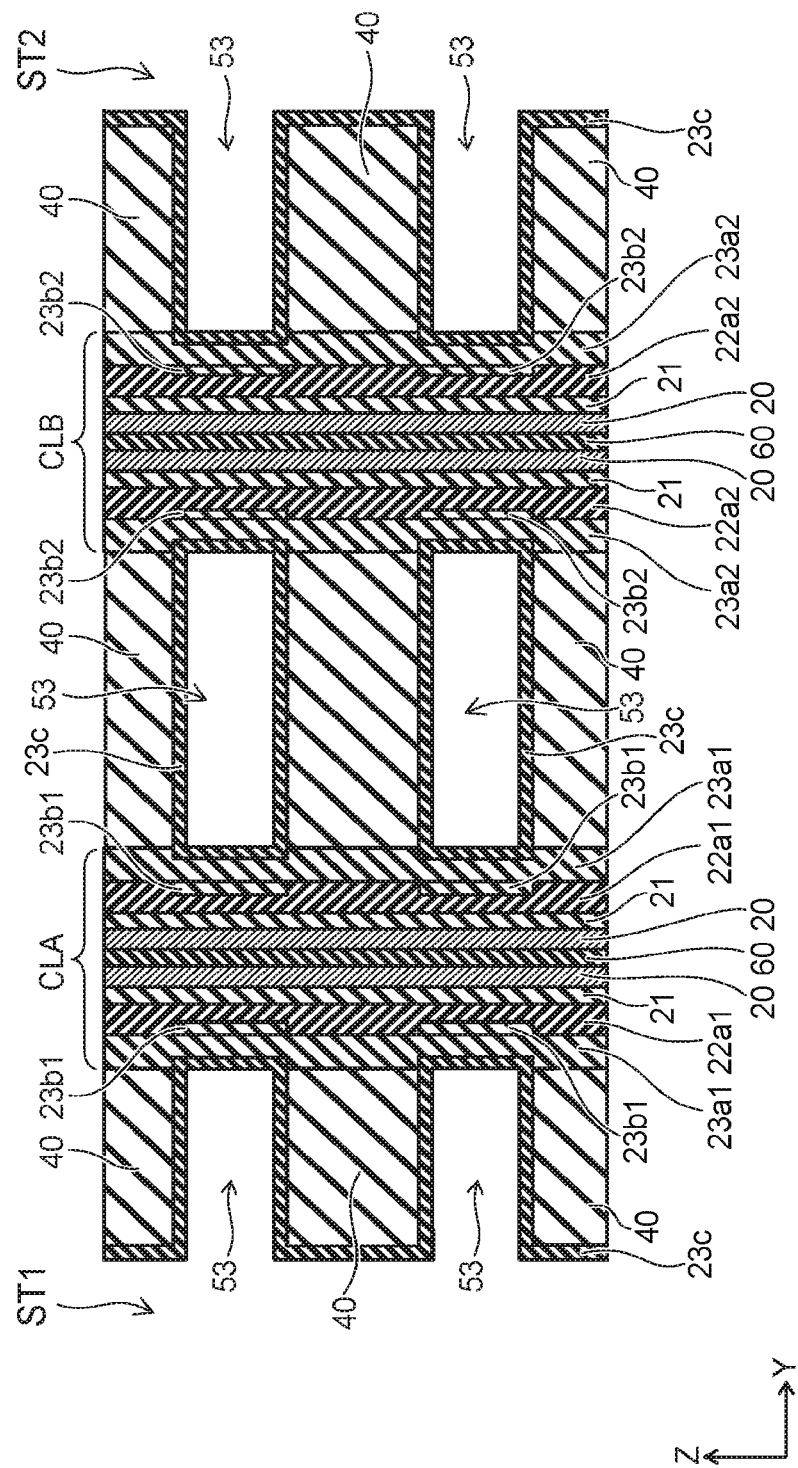

Then, as shown in FIG. 11, the oxide film 23c is formed by depositing aluminum oxide on an entire surface, for example, using CVD method. The oxide film 23c is formed around the oxide films 23a1, 23a2 and on the insulating layer 40. Thereby, the blocking insulating film 23 is formed.

Here, the radical oxidation process of the nitride films 22A1, 22A2 shown in FIG. 10 may be performed after forming the oxide film 23c. In this case, a part of the nitride film 22A1 is oxidized via the oxide film 23c and the oxide film 23A1 in the memory hole 51A, and a part of the nitride film 22A2 is oxidized via the oxide film 23c and the oxide film 23A2 in the memory hole 51B.

Figure 12:
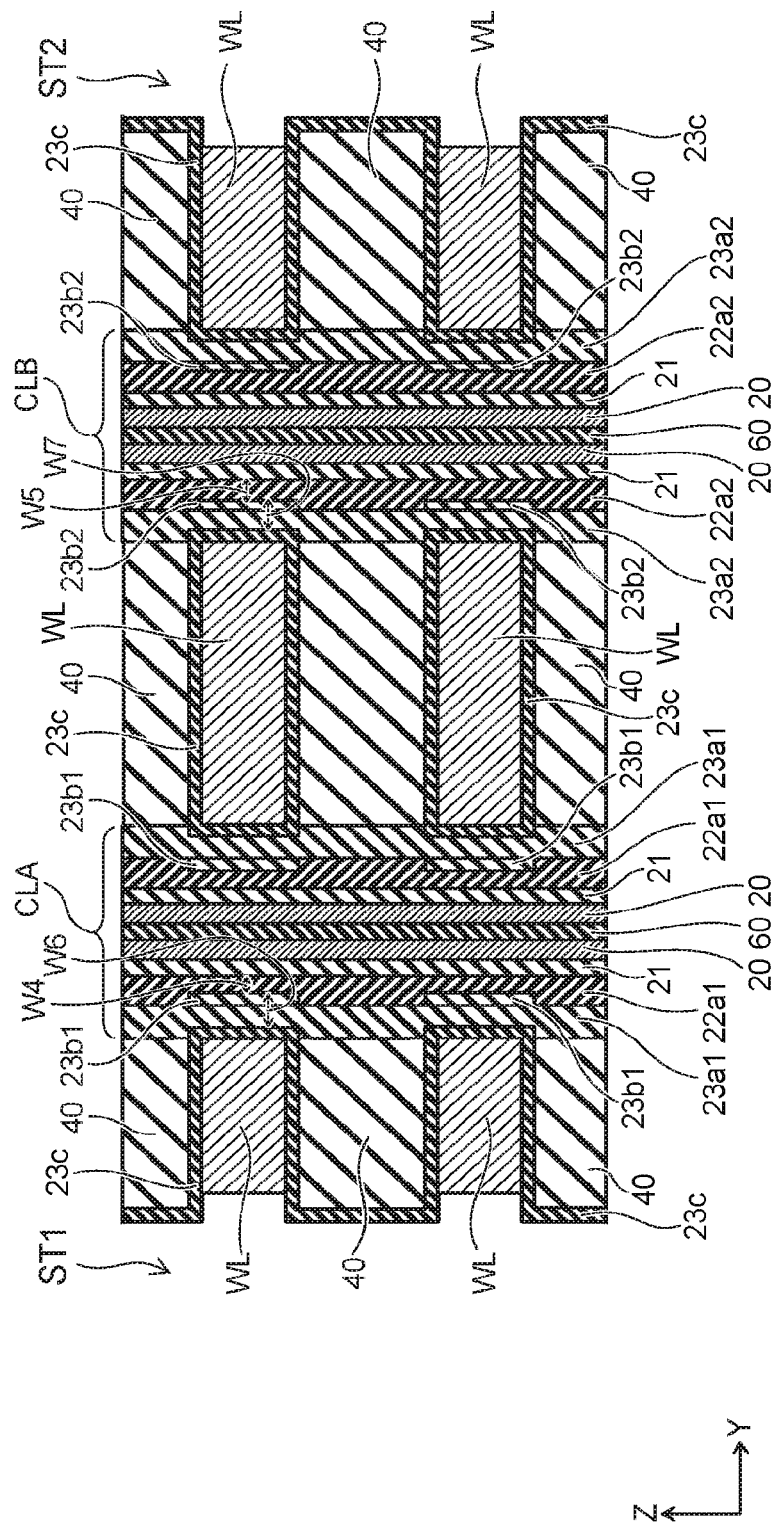

Then, as shown in FIG. 12, conductive layers are formed on an entire surface by, for example, CVD method. The conductive layer also enters an interior of the space 53 via the slits ST1, ST2. After that, the conductive layers are etched by isotropic etching such as CDE (Chemical Dry Etching) or wet etching so as not to short the adjacent conductive layers in the Z-direction. Thereby, the source-side select gate SGS, the drain-side select gate SGD, and the plurality of word lines WL are formed. The stacked body 15 including the electrode layers (SGS, WL, SGD) and the plurality of insulating layers 40 is formed.

In the columnar portions CLA, CLB located in the same word line WL, the width W4 of the charge storage films 22a1 of the columnar portion CLA is smaller than the width W5 of the charge storage film 22a2 of the columnar portion CLB. The width W6 of the oxide film 23a1 of the columnar portion CLA is the width W7 of the oxide film 23a2 of the columnar portion CLB or less.

After that, after depositing silicon oxide on the entire surface, an insulating film is etched back to leave on side surfaces of the slits ST1, ST2, thereby forming the insulating films 19. Continuously, metal such as tungsten is deposited in the slits ST1, ST2 to form the interconnect portions 18.

In this way, the semiconductor device 1 according to the first embodiment is manufactured.

Hereinafter, an effect of the first embodiment is described.

In the semiconductor memory device having a three-dimensional structure, when forming the slits and the memory holes in the stacked body, a plurality of memory holes sometimes is disposed such that the difference in distance between the slit occurs. In this arrangement of the memory holes, when removing the sacrificial layer using hot phosphoric acid, the oxide film formed in the memory hole having a short distance from the slit is in contact long to hot phosphoric acid as compared to the oxide film formed in the memory hole having a long distance from the slit. The oxide film exposed to hot phosphoric acid for a long period of time is easily etched by hot phosphoric acid. Thereby, there is a possibility that variation arises in the thickness of the oxide film formed in each memory hole depending on the distance between the memory hole and the slit.

In the semiconductor memory device 1 of the embodiment, in the same word line WL, the width of the charge storage film 22 of the columnar portion CL disposed at the outside of the word line WL is smaller than the width of the charge storage film 22 of the columnar portion CL disposed at the inside of the word line WL. Further, the width of the oxide film 23a of the columnar portion CL disposed at the outside of the word line WL is the width of the oxide film 23a of the columnar portion CL disposed at the inside of the word line WL or less.

When the plurality of columnar portions CL is disposed in this manner, it is possible to reduce the difference of the widths of the oxide films 23a in the same word line WL. Since uniformity of a width of each oxide film 23a can be ensured, it is possible to suppress the moving of the charge in the charge storage film 22 via the oxide film 23a having a thin thickness. In other words, since leak currents via the oxide film 23a can be suppressed, charge retention characteristic of the charge storage film 22 is improved.

Further, since the uniformity of the width of each oxide film 23a can be ensured, for example, when the charge is moved from the semiconductor body 20 to the charge storage film 22 (programming operation), it is possible to reduce variation of a programming speed of the memory cell MC. Therefore, an operating characteristic of the memory cell MC can be improved.

Second Embodiment

Figure 13:
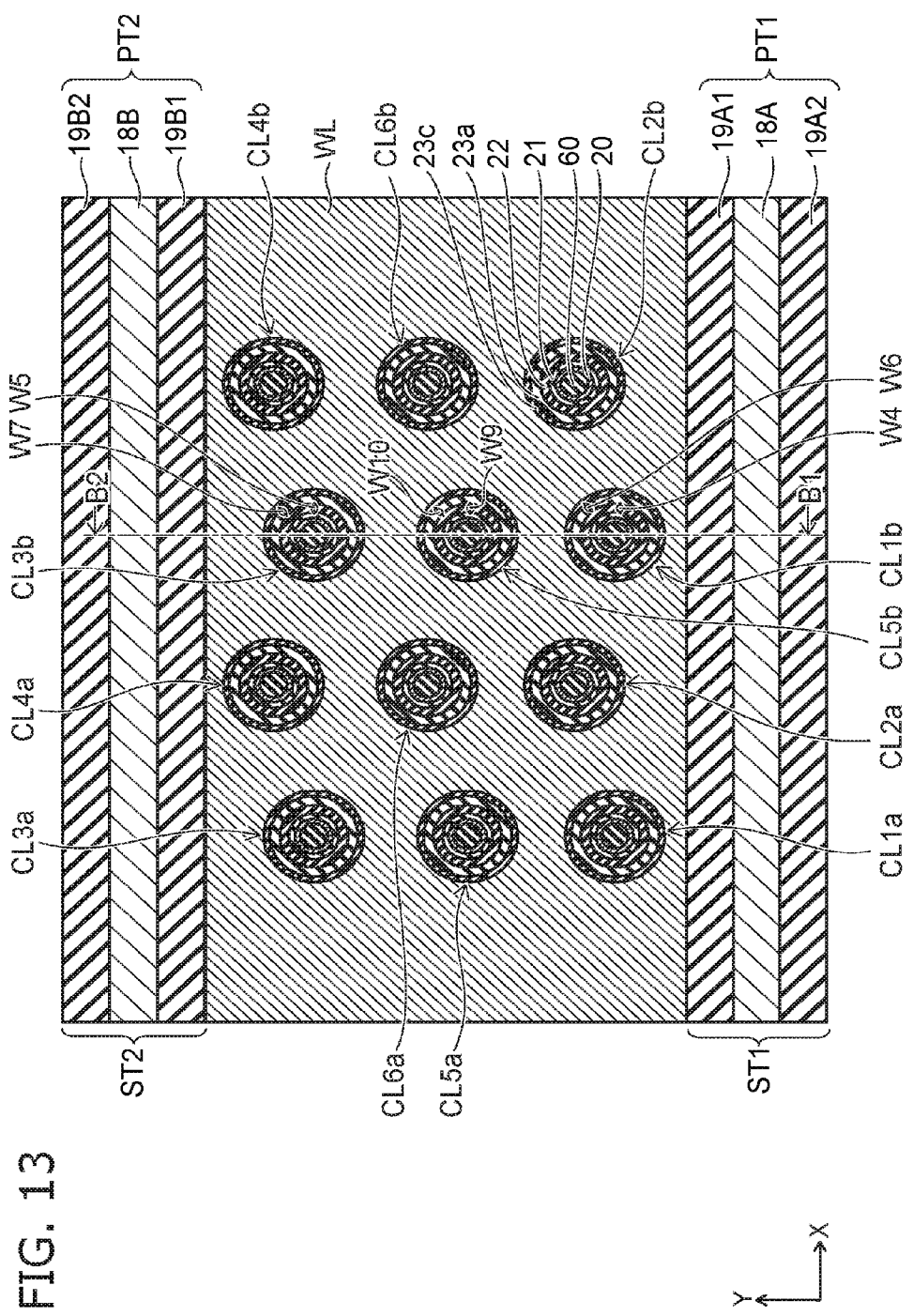
FIG. 13 is a plan view of a part of a semiconductor memory device of a second embodiment.
Figure 14:
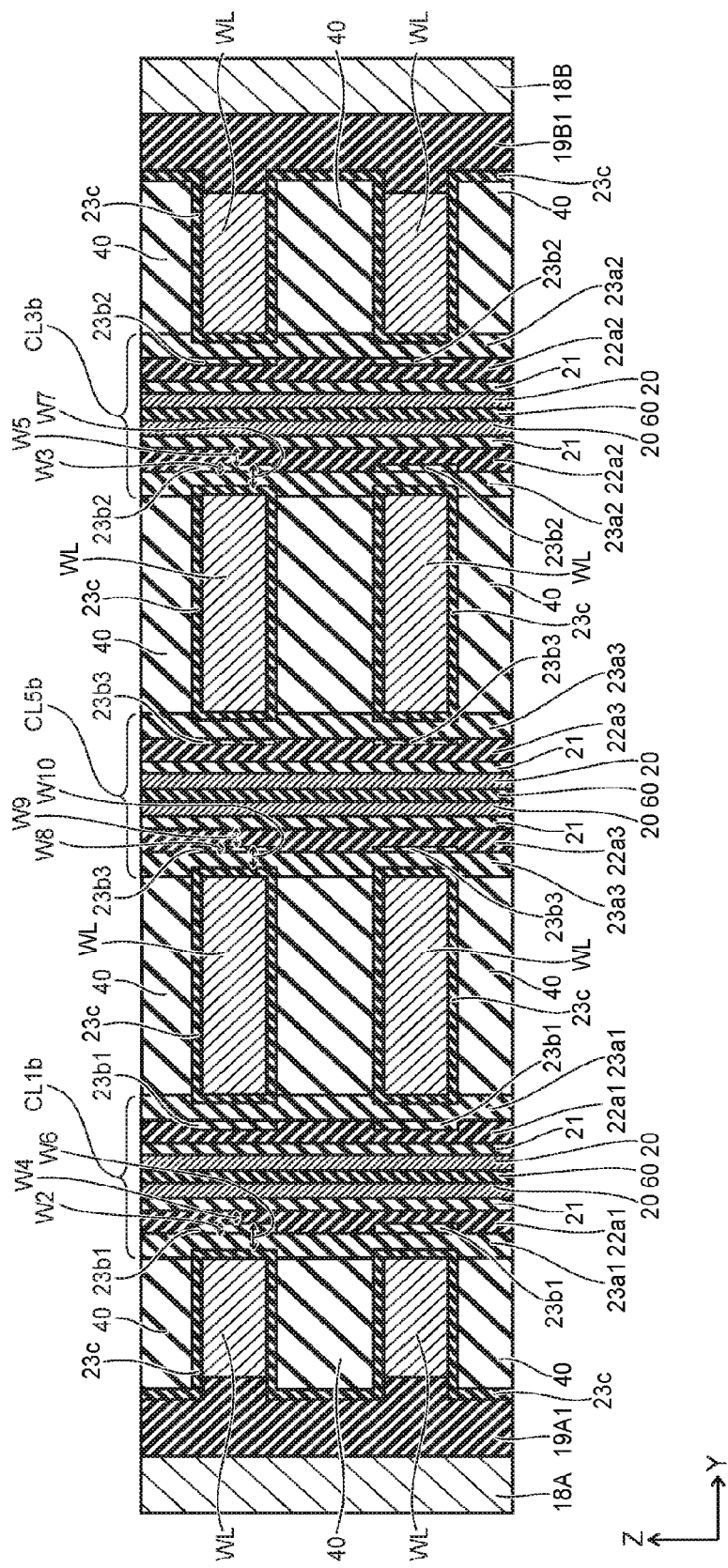
FIG. 14 is a cross-sectional view of a part of the semiconductor memory device of the second embodiment.

FIG. 13 is an enlarge plan view extracting one portion of the word line WL between the slits ST. FIG. 14 is the Y-Z cross-sectional view by the B1-B2 line of FIG. 13.

The embodiment and the first embodiment are different in the arrangement of the columnar portions CL in the word line WL. Since structure except for the arrangement of the columnar portions CL is same as the first embodiment, detailed description of the other structure is omitted.

As shown in FIG. 13, the plurality of columnar portions CL is disposed in a staggered lattice configuration between the slit ST1 and the slit ST2. As viewed in the Z-direction, the columnar portions CL1a, CL1b, CL2a, CL2b, CL3a, CL3b, CL4a, CL4b, CL5a, CL5b, CL6a, CL6b are disposed in the word line WL. If a virtual straight line along the X-direction has been set on the word line WL, the columnar portion CL1a and the columnar portion CL1b are located on the same straight line. Further, if a virtual straight line along the X-direction has been set on the word line WL, the columnar portion CL2a and the columnar portion CL2b, the columnar portion CL3a and the columnar portion CL3b, the columnar portion CL4a and the columnar portion CL4b, the columnar portion CL5a and the columnar portion CL5b, and the columnar portion CL6a and the columnar portion CL6b are located on the same straight line, respectively.

The columnar portions CL1a, CL1b, CL2a, CL2b are disposed at the slit ST1 side of the word line WL, and the columnar portions CL3a, CL3b, CL4a, CL4b are disposed at the slit ST2 side of the word line WL.

The columnar portion CL5a is located between the columnar portion CL1a and the columnar portion CL3a, and the columnar portion CL5b is located between the columnar portion CL1b and the columnar portion CL3b. The columnar portion CL6a is located between the columnar portion CL2a and the columnar portion CL4a, and the columnar portion CL6b is located between the columnar portion CL2b and the columnar portion CL4b.

The columnar portions CL1a, CL1b are disposed so that the distances between the columnar portion CL1a and the slit ST1 and between the columnar portion CL1b and the slit ST1 are the shortest distance among all the columnar portions CL. The columnar portions CL4a, CL4b are disposed so that the distances between the columnar portion CL4a and the slit ST2 and between the columnar portion CL4b and the slit ST2 are the shortest distance among all the columnar portions CL.

The columnar portions CL2a, CL2b are disposed so that the distances between the columnar portion CL2a and the slit ST1 and between the columnar portion CL2b and the slit ST1 are short as compared with distances between the columnar portion CL6a and the slit ST1 and between the columnar portion CL6b and the slit ST1.

The columnar portions CL3a, CL3b are disposed so that the distances between the columnar portion CL3a and the slit ST2 and between the columnar portion CL3b and the slit ST2 are short as compared with distances between the columnar portion CL5a and the slit ST2 and between the columnar portion CL5b and the slit ST2.

The columnar portions CL1a, CL1b, CL2a, CL2b, CL3a, CL3b, CL4a, CL4b are disposed at the outside of the word line WL, and the columnar portions CL5a, CL5b, CL6a, CL6b are disposed at the inside of the word line WL.

Hereinafter, the columnar portions CL which are disposed at the outside and the inside of the word line WL, respectively will now be described.

As shown in FIG. 14, the columnar portions CL1b, CL3b, CL5b are located in the word line WL.

In the columnar portion CL1b which is located in the word line WL, the oxide film 23a1 has the oxide portion 23b1 provided around the charge storage film 22a1. As viewed in the Z-direction, the oxide portion 23b1 overlaps with a part of the charge storage film 22a1 of the columnar portion CL1b which is located in the insulating layer 40.

In the columnar portion CL3b which is located in the word line WL, the oxide film 23a2 has the oxide portion 23b2 provided around the charge storage film 22a2. As viewed in the Z-direction, the oxide portion 23b2 overlaps with a part of the charge storage film 22a2 of the columnar portion CL3b which is located in the insulating layer 40.

In the columnar portion CL5b which is located in the word line WL, the oxide film 23a3 has the oxide portion 23b3 provided around the charge storage film 22a3. As viewed in the Z-direction, the oxide portion 23b3 overlaps with a part of the charge storage film 22a3 of the columnar portion CL5b which is located in the insulating layer 40.

In the columnar portions CL1b, CL3b, CL5b located in the same word line WL, the width W2 of the oxide portion 23b1 of the columnar portion CL1b is greater than the width W3 of the oxide portion 23b2 of the columnar portion CL3b. The width W3 is greater than a width W8 of the oxide portion 23b3 of the columnar portion CL5b.

Further, the width W4 of the charge storage film 22a1 of the columnar portion CL1b is smaller than the width W5 of the charge storage film 22a2 of the columnar portion CL3b. The width W5 is smaller than a width W9 of the charge storage film 22a3 of the columnar portion CL5b. The width W4, the width W5, and the width W9 are, for example, 5 nanometers or more.

Further, the width W6 of the oxide film 23a1 of the columnar portion CL1b is the width W7 of the oxide film 23a2 of the columnar portion CL3b or less. The width W7 is a width W10 of the oxide film 23a3 of the columnar portion CL5b or less. For example, the width W6, the width W7, and the width 10 will be approximately the same.

Hereinafter, an effect of the second embodiment is described.

In the semiconductor memory device 1 of the embodiment, in the same word line WL, the width of the charge storage film 22 of the columnar portion CL disposed at the outside of the word line WL is smaller than the width of the charge storage film 22 of the columnar portion CL disposed at the inside of the word line WL. Further, in the plurality of columnar portions CL disposed at the outside of the word line WL, the width of the charge storage film 22 of the columnar portion CL having a short distance between the slit ST and the columnar portion CL is smaller than the width of the charge storage film 22 of the columnar portion CL having a long distance between the slit ST and the columnar portion CL.

Furthermore, the width of the oxide film 23a of the columnar portion CL disposed at the outside of the word line WL is the width of the oxide film 23a of the columnar portion CL disposed at the inside of the word line WL or less. In addition, in the plurality of columnar portions CL disposed at the outside of the word line WL, the width of the oxide film 23a of the columnar portion CL having a short distance between the slit ST and the columnar portion CL is the width of the oxide film 23a of the columnar portion CL having a long distance between the slit ST and the columnar portion CL or less.

When the plurality of columnar portions CL is disposed in this manner, it is possible to reduce the difference of the widths of the oxide films 23a in the same word line WL. Thereby, it is possible to ensure the uniformity of the width of each oxide film 23a and suppress the reducing of the charge retention characteristic of the charge storage film 22 of each memory cell MC. Further, since the programming speed of the memory cell MC is increased, the operating characteristic of the memory cell MC is improved.

Therefore, the failure of operation of the memory cell MC can be suppressed.

In the first embodiment and the second embodiment, although two or three columnar portions CL are disposed in the word line WL in the Y-direction, the number of the columnar portions CL and the arrangement of the columnar portions CL are arbitrary. For example, any number of the columnar portions CL may be disposed in the word line WL in the Y-direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device, comprising:
a substrate;
a stacked body provided on the substrate and including a plurality of electrode layers separately stacked each other;
a first columnar portion provided in the stacked body and including
a first semiconductor film extending in a stacking direction of the stacked body,
a first charge storage film provided between the stacked body and the first semiconductor film, and
a first insulating film provided between the stacked body and the first charge storage film;
a second columnar portion provided in the stacked body and including
a second semiconductor film extending in the stacking direction,
a second charge storage film provided between the stacked body and the second semiconductor film, and
a second insulating film provided between the stacked body and the second charge storage film; and
a plurality of first interconnects extending in a first direction crossing the stacking direction and provided on the first columnar portion and the second columnar portion,
a distance between the first columnar portion and one end of the plurality of electrode layers in the first direction being smaller than a distance between the second columnar portion and the other end of the plurality of electrode layers in the first direction, and
in the same electrode layer, a first width of the first charge storage film being smaller than a second width of the second charge storage film.

2. The device according to claim 1, wherein in the same electrode layer, a third width of the first insulating film is equal to or smaller than a fourth width of the second insulating film.

3. The device according to claim 1, wherein the first width and the second width are 5 nanometers or more.

4. The device according to claim 1, wherein
the stacked body further includes a plurality of insulating layers, the plurality of insulating layers and the plurality of electrode layers being alternately stacked one by one,
as viewed in the stacking direction, a part of the first insulating film located in each of the electrode layers overlaps with a part of the first charge storage film located in each of the insulating layers, and
as viewed in the stacking direction, a part of the second insulating film located in each of the electrode layers overlaps with a part of the second charge storage film located in each of the insulating layers.

5. The device according to claim 1, wherein
the first insulating film and the second insulating film include silicon oxide,
the first insulating film includes a first oxide portion located in each of the electrode layers and provided on a side surface of the first charge storage film,
the second insulating film includes a second oxide portion located in each of the electrode layers and provided on a side surface of the second charge storage film, and
a fifth width of the first oxide portion is greater than a sixth width of the second oxide portion.

6. The device according to claim 2, further comprising:
a third columnar portion provided in the stacked body and including
a third semiconductor film extending in the stacking direction,
a third charge storage film provided between the stacked body and the third semiconductor film, and
a third insulating film provided between the stacked body and the third charge storage film,
the third columnar portion being located between the first columnar portion and the second columnar portion in the first direction,
wherein in the same electrode layer, a seventh width of the third charge storage film is greater than the second width, and
in the same electrode layer, an eighth width of the third insulating film is equal to or greater than the fourth width.

7. The device according to claim 6, wherein
the third insulating film includes silicon oxide, and
the third insulating film includes a third oxide portion located in each of the electrode layers and provided on a side surface of the third charge storage film.

8. The device according to claim 1, wherein
a width of the first charge storage film located in each of the electrode layers is substantially the same, and
a width of the first insulating film located in each of the electrode layers is substantially the same.

9. The device according to claim 1, wherein the first insulating film and the second insulating film include silicon oxide.

10. The device according to claim 1, wherein the first charge storage film and the second charge storage film include silicon nitride.

11. A semiconductor memory device, comprising:
a substrate;
a stacked body provided on the substrate and including a plurality of electrode layers separately stacked each other;
a first plate portion and a second plate portion provided in the stacked body, each of the first plate portion and the second plate portion spreading along a stacking direction of the stacked body and a first direction crossing the stacking direction, and the first plate portion and the second plate portion being disposed along a second direction crossing the stacking direction and the first direction;
a first columnar portion provided in the stacked body and including
a first semiconductor film extending in the stacking direction,
a first charge storage film provided between the stacked body and the first semiconductor film, and
a first insulating film provided between the stacked body and the first charge storage film,
the first columnar portion being located at the first plate portion side between the first plate portion and the second plate portion; and
a second columnar portion provided in the stacked body and including
a second semiconductor film extending in the stacking direction,
a second charge storage film provided between the stacked body and the second semiconductor film, and
a second insulating film provided between the stacked body and the second charge storage film,
the second columnar portion being located at the second plate portion side between the first plate portion and the second plate portion,
a distance in the second direction between the first columnar portion and the first plate portion being smaller than a distance in the second direction between the second columnar portion and the second plate portion, and
in the same electrode layer, a first width of the first charge storage film being smaller than a second width of the second charge storage film.

12. The device according to claim 11, wherein in the same electrode layer, a third width of the first insulating film is equal to or smaller than a fourth width of the second insulating film.

13. The device according to claim 11, wherein the first width and the second width are 5 nanometers or more.

14. The device according to claim 11, wherein
the stacked body further includes a plurality of insulating layers, the plurality of insulating layers and the plurality of electrode layers being alternately stacked one by one,
as viewed in the stacking direction, a part of the first insulating film located in each of the electrode layers overlaps with a part of the first charge storage film located in each of the insulating layers, and
as viewed in the stacking direction, a part of the second insulating film located in each of the electrode layers overlaps with a part of the second charge storage film located in each of the insulating layers.

15. The device according to claim 11, wherein
the first insulating film and the second insulating film include silicon oxide,
the first insulating film includes a first oxide portion located in each of the electrode layers and provided on a side surface of the first charge storage film,
the second insulating film includes a second oxide portion located in each of the electrode layers and provided on a side surface of the second charge storage film, and
a fifth width of the first oxide portion is greater than a sixth width of the second oxide portion.

16. The device according to claim 12, further comprising:
a third columnar portion provided in the stacked body and including
a third semiconductor film extending in the stacking direction,
a third charge storage film provided between the stacked body and the third semiconductor film, and
a third insulating film provided between the stacked body and the third charge storage film,
the third columnar portion being located between the first columnar portion and the second columnar portion in the second direction,
wherein in the same electrode layer, a seventh width of the third charge storage film is greater than the second width, and in the same electrode layer, an eighth width of the third insulating film is equal to or greater than the fourth width.

17. The device according to claim 16, wherein
the third insulating film includes silicon oxide, and
the third insulating film includes a third oxide portion located in each of the electrode layers and provided on a side surface of the third charge storage film.

18. The device according to claim 11, wherein
a width of the first charge storage film located in each of the electrode layers is substantially the same, and
a width of the first insulating film located in each of the electrode layers is substantially the same.

19. The device according to claim 11, wherein the first insulating film and the second insulating film include silicon oxide.

20. The device according to claim 11, wherein the first charge storage film and the second charge storage film include silicon nitride.

* * * * *